United States Patent [19]
Ljungberg et al.

[11] Patent Number: 5,654,035
[45] Date of Patent: Aug. 5, 1997

[54] METHOD OF COATING A BODY WITH AN α-ALUMINA COATING

[75] Inventors: Bjorn Ljungberg, Enskede; Anders Lenander, Tyreso, both of Sweden

[73] Assignee: Sandvik AB, Sandviken, Sweden

[21] Appl. No.: 532,359

[22] Filed: Sep. 22, 1995

Related U.S. Application Data

[62] Division of Ser. No. 159,217, Nov. 30, 1993, Pat. No. 5,487,625.

[30] Foreign Application Priority Data

Dec. 18, 1992 [SE] Sweden ................................ 9203852

[51] Int. Cl.⁶ ........................................... C23C 16/40
[52] U.S. Cl. ........................... 427/255.3; 427/255.7
[58] Field of Search .......................... 427/248.1, 249, 427/255.3, 255.7

[56] References Cited

U.S. PATENT DOCUMENTS

| Re. 29,420 | 9/1977 | Lindstrom et al. | 428/336 |
|---|---|---|---|
| Re. 32,093 | 3/1986 | Hale | 428/336 |
| Re. 32,110 | 4/1986 | Hale | 428/336 |
| 3,736,107 | 5/1973 | Hale | 29/182.7 |
| 3,837,896 | 9/1974 | Lindstrom et al. | 117/70 A |
| 3,914,473 | 10/1975 | Hale | 427/255 |
| 3,967,035 | 6/1976 | Hale | 428/336 |
| 3,977,061 | 8/1976 | Lindstrom et al. | 29/95 R |
| 4,018,631 | 4/1977 | Hale | 148/31.5 |
| 4,399,168 | 8/1983 | Kullander et al. | 427/255.7 |
| 4,463,033 | 7/1984 | Kikuchi et al. | 427/255.3 |
| 4,490,191 | 12/1984 | Hale | 148/31.5 |
| 4,698,266 | 10/1987 | Buljan et al. | 428/457 |
| 5,071,696 | 12/1991 | Chatfield et al. | 428/220 |
| 5,137,774 | 8/1992 | Ruppi | 428/216 |
| 5,162,147 | 11/1992 | Ruppi | 428/216 |
| 5,543,176 | 8/1996 | Chatfield et al. | 427/255.3 |

FOREIGN PATENT DOCUMENTS

| 32887 | 7/1981 | European Pat. Off. . |
|---|---|---|
| 4110005 | 10/1992 | Germany . |
| 4110006 | 10/1992 | Germany . |
| 4131307 | 3/1993 | Germany . |
| 57-137460 | 8/1982 | Japan . |

*Primary Examiner*—Shrive Beck
*Assistant Examiner*—Timothy Meeks
*Attorney, Agent, or Firm*—Burns, Doane, Swecker & Mathis, L.L.P.

[57] ABSTRACT

A method of coating a body coated with refractory single- or multi-layers, wherein specific layers are characterized by a controlled microstructure and phase composition with crystal planes preferably grown in a preferential direction with respect to the surface of the coated body. The coating comprises one or several refractory layers of which at least one layer is a dense, fine-grained layer of α-$Al_2O_3$ preferably textured in the (012) direction. The coated tool according to the present invention exhibits excellent surface finish and shows much improved wear and toughness properties compared to prior art objects when used for machining steel, cast iron and, particularly, when machining nodular cast iron.

8 Claims, 1 Drawing Sheet

METHOD OF COATING A BODY WITH AN α-ALUMINA COATING

This application is a divisional of U.S. application Ser. No. 08/159,217 filed Nov. 30, 1993, now U.S. Pat. No. 5,487,625.

BACKGROUND OF THE INVENTION

The present invention relates to a coated cutting tool for chip forming machining.

The Chemical Vapor Deposition (CVD) of alumina on cutting tools has been an industrial practice for more than 15 years. The wear properties of $Al_2O_3$ as well as of other refractory materials have been discussed extensively in the literature.

The CVD-technique has also been used to produce coatings of other metal oxides, carbides and nitrides, with the metal being selected from transition metals of the IVB, VB and VIB groups of the Periodic Table. Many of these compounds have found practical applications as wear resistant or protective coatings, but few have received as much attention as TiC, TiN and $Al_2O_3$.

Cemented carbide cutting tools coated with various types $Al_2O_3$-coatings, e.g., pure κ-$Al_2O_3$, mixtures of κ- and α-$Al_2O_3$ and very coarse-grained α-$Al_2O_3$ have been commercially available for many years. None of these oxide coated products have shown desirable cutting properties when used for machining nodular cast iron. Nodular cast iron is a work piece material difficult to machine since it adheres onto the cutting edge of the tool resulting in a successive and fast removal of the coating from the cutting edge and, hence, a shortened tool life of the cutting inserts.

$Al_2O_3$ crystallizes in several different phases: α, κ, γ, β, θ, etc. The two most frequently occurring phases in CVD of wear resistant $Al_2O_3$-coatings are the thermodynamically stable, hexagonal α-phase and the metastable κ-phase. Generally, the κ-phase is fine-grained with a grain size in the range 0.5–2.0 μm and often exhibits a columnar coating morphology. Furthermore, κ-$Al_2O_3$ coatings are free from crystallographic defects and free from micropores or voids.

The α-$Al_2O_3$ grains are usually coarser with a grain size of 1–6 μm depending upon the deposition conditions. Porosity and crystallographic defects are in this case more common.

Often, both α- and κ-phase are present in a CVD alumina coating deposited onto a cutting tool. In commercial cutting tools, $Al_2O_3$ is always applied on TiC coated carbide or ceramic substrates (see, e.g., U.S. Pat. No. 3,837,896, now U.S. Reissue Pat. No. 29,420) and therefore the interfacial chemical reactions between the TiC surface and the alumina coating are of particular importance. In this context, the TiC layer should also be understood to include layers having the formula $TiC_xN_yO_z$ in which the carbon in TiC is completely or partly substituted by oxygen and/or nitrogen.

The practice of coating cemented carbide cutting tools with oxides to further increase their wear resistance is in itself well-known as is evidenced in U.S. Reissue Pat. No. 29,420, and U.S. Pat. Nos. 4,399,168, 4,018,631, 4,490,191 and 4,463,033. These patents disclose oxide coated bodies and how different pretreatments, e.g., of TiC coated cemented carbide, enhance the adherence of the subsequently deposited oxide layer. Although the disclosed methods result in alumina layers tightly and adherently bonded to the cemented carbide body or to a refractory layer of, e.g., TiC adjacent to the cemented carbide, they do not result in the particular α-polymorph of $Al_2O_3$ as disclosed in the present invention.

Alumina coated bodies are further disclosed in U.S. Pat. No. 3,736,107, U.S. Ser. No. 08/128,741 (our reference: 024000-805) and U.S. Pat. Nos. 5,137,774 and 5,162,147 wherein the $Al_2O_3$-layers comprise α, κ resp., α/κ combinations. However, these patents do not disclose the desired microstructure and crystallographic texture of the α-polymorph which is the object of the present invention.

OBJECTS AND SUMMARY OF THE INVENTION

It is an object of this invention to avoid or alleviate the problems of the prior art.

It is further an object of this invention to provide onto a hard substrate or preferably onto a hard substrate having the aforementioned $TiC_xN_yO_z$ coating at least one single phase $Al_2O_3$ layer of the a polymorph with a desired microstructure and crystallographic texture using suitable nucleation and growth conditions such that said properties of the $Al_2O_3$ layer are stable.

It is yet another object of this invention to provide an alumina coated cutting tool insert with improved cutting performance in steel, stainless steel, cast iron and, in particular, in nodular cast iron.

In one aspect of the invention there is provided a body at least partially coated with one or more refractory layers of which at least one layer is alumina, said alumina layer having a thickness (d) of 0.5–25 μm and a single phase α-structure with a grain size (s):

0.5 μm<s<1 μm for 0.5 μm<d<2.5 μm and 0.5 μm<s<3 μm for 2.5 μm<d<25 μm.

In another aspect of the invention there is provided a method of coating a body with an α-alumina coating comprising bringing the body in contact with a hydrogen carrier gas containing one or more halides of aluminum and a hydrolyzing and/or oxidizing agent at high temperature, the oxidation potential of the hydrogen carrier gas being below 20 ppm of $H_2O$ prior to the nucleation of $Al_2O_3$, the nucleation of $Al_2O_3$ being started by sequencing the reactant gases in the following order: $CO_2$, CO and $AlCl_3$ and the temperature being about 1000° C. during the nucleation.

BRIEF DESCRIPTION OF THE DRAWING

The FIGURE shows a Scanning Electron Microscope (SEM) top view micrograph at 2000X magnification of a typical $Al_2O_3$-coating according to the invention.

DETAILED DESCRIPTION OF THE PREFERRED EMBODIMENTS OF THE INVENTION

Figure 1:
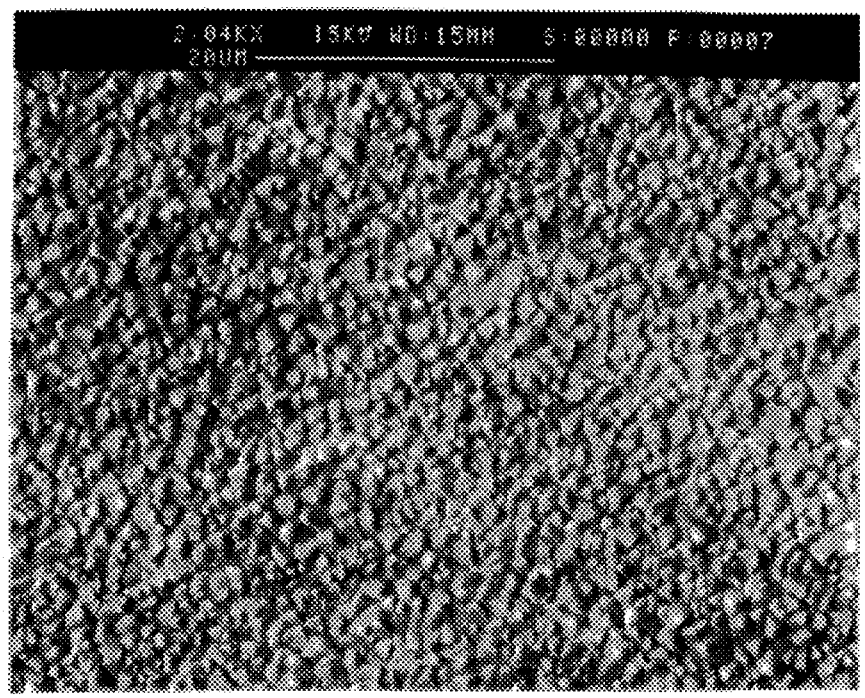

According to the present invention, there is now provided a cutting tool comprising a body of a hard alloy onto which a wear resistant coating has been deposited. The coating comprises one or several refractory layers of which at least one layer is a dense, fine-grained and preferably textured $Al_2O_3$-layer of the polymorph α.

A coated cutting tool according to the present invention exhibits improved wear and toughness properties compared to prior art tools when used for machining steel or cast iron, particularly if its surface has been further smoothed by wet blasting.

More specifically, the coated tool comprises a substrate of a sintered cemented carbide body, cermet or a ceramic body preferably of at least one metal carbide in a metal binder phase. The individual layers in the coating structure may be TiC or related carbide, nitride, carbonitride, oxycarbide and oxycarbonitride of a metal selected from the group consisting of metals in the Groups IVB, VB and VIB of the Periodic Table, B, Al and Si and/or mixtures thereof. At least one of said layers is in contact with the substrate. However, at least one of the layers in the coating structure comprises a fine-grained, preferentially textured layer of single phase $\alpha$-Al$_2$O$_3$ having a thickness (d) of 0.5–25 μm with a grain size (s) of 0.5 μm<s<1 μm for 0.5 μm<d<2.5 μm and 0.5 μm<s<3 μm for 2.5 μm<d<25 μm.

The fine-grained microstructure comprises a narrow grain size distribution. Most often, 80% of the Al$_2$O$_3$ grains have a grain size ±50% of the average grain size.

The grain size of the Al$_2$O$_3$ -coating is determined from a SEM top view micrograph at 5000X magnification. Drawing three straight lines In random directions, the average distances between grain boundaries along the lines are taken as a measure of the grain size.

The Al$_2$O$_3$-layer according to the present invention has a preferred crystal growth orientation in the (012) direction which is determined by X-Ray Diffraction (XRD) measurements. A Texture Coefficient, TC, can be defined as:

$$TC(hkl) = \frac{I(hkl)}{I_o(hkl)} \left\{ \frac{1}{n} \Sigma \frac{I(hkl)}{I_o(hkl)} \right\}^{-1}$$

where
I(hkl)=measured intensity of the (hkl) reflection;
I$_o$(hkl)=standard intensity of the ASTM standard powder pattern diffraction data; and
n=number of reflections used in the calculation, (hkl) reflections used are: (012), (104), (110), (113), (024), (116).

According to the present invention, the TC for the set of (012) crystal planes is greater than 1.3, preferably greater than 1.5.

The coated body according to the invention is further characterized by a surface roughness (R$_a$) of the refractory coating of less than 0.3 μm over a measured length of 0.25 mm. Preferably, the Al$_2$O$_3$-layer is the outermost layer. The coated bodies are particularly useful as inserts for cutting of metal, preferably nodular cast iron.

The textured Al$_2$O$_3$-coating according to the present invention is obtained by careful control of the oxidation potential of the hydrogen carrier gas being controlled by maintaining the H$_2$O content preferably below 20 ppm, most preferably below 5 ppm, of H$_2$O, prior to the nucleation of Al$_2$O$_3$. The nucleation of Al$_2$O$_3$ is started by sequencing the reactant gases in the following order: CO$_2$, CO and AlCl$_3$. The temperature shall preferably be about 1000° C. during the nucleation. However, the exact conditions depend to a certain extent on the design of the equipment used. It is within the purview of the skilled artisan to determine whether the requisite texture has been obtained and to modify the deposition conditions in accordance with the present specification, if desired, to effect the amount of texture.

The $\alpha$-Al$_2$O$_3$ coatings according to the present invention are dense and free of microporosity and crystallographic defects. This is in contrast to previous reports on $\alpha$-Al$_2$O$_3$-coatings.

The invention is additionally illustrated in connection with the following Examples which are to be considered as illustrative of the present invention. It should be understood, however, that the invention is not limited to the specific details of the Examples.

EXAMPLE 1

A) Cemented carbide cutting inserts with the composition 5.5% Co, 8.5% cubic carbides and balance WC were coated with a 5 μm thick layer of TiCN. In subsequent process steps during the same coating cycle, a fine-grained (1–2 μm), 7 μm thick layer of $\alpha$-Al$_2$O$_3$ was deposited. The oxidation potential of the hydrogen carrier gas, i.e., the water vapor concentration, was explicitly set forth to a relatively low level, 10 ppm, prior to and during the Al$_2$O$_3$ nucleation, (See also U.S. Pat. No. 5,071,696).

A reaction gas mixture comprising CO$_2$, CO and AlC$_3$ was subsequently added to the hydrogen carrier gas in given order.

The gas mixtures and other process conditions during the Al$_2$O$_3$ deposition steps comprised:

| 1. | | 2. | |
| --- | --- | --- | --- |
| CO$_2$ | 4% | CO$_2$ | 4% |
| AlCl$_3$ | 4% | AlCl$_3$ | 4% |
| CO | 2% | H$_2$S | 0.2% |
| H$_2$ | balance | H$_2$ | balance |
| Process | | Process | |
| Pressure | 65 mbar | Pressure | 65 mbar |
| Temperature | 1000° C. | Temperature | 1030° C. |
| Duration | 1 hour | Duration | 5.5 hours |

XRD-analysis showed a texture coefficient, TC (012), of 2.1 of the (012) planes in the single $\alpha$-phase of the Al$_2$O$_3$-coating. The Al$_2$O$_3$ coating had a surface roughness R$_a$ of 0.2 μm measured over a 0.25 mm length.

B) The carbide substrate of A) was coated with TiCN (5 μm) and Al$_2$O$_3$ (7 μm) as set forth in A) except for that the Al$_2$O$_3$ process was carried out according to the prior art technique resulting in a mixture of coarse $\alpha$- and fine $\kappa$-Al$_2$O$_3$ grains in the coating.

C) Tool inserts of the same substrate and coating composition and coating thickness as of A) except for that the Al$_2$O$_3$ coating comprises the single phase $\kappa$-polymorph according to prior art technique.

Coated tool inserts from A), B) and C) were all wet blasted with 150 mesh Al$_2$O$_3$ powder in order to smooth the coating surface.

The cutting inserts were then tested with respect to edge line and rake face flaking in a facing operation in nodular cast iron (AISI 60-40-18, DIN GGG40). The shape of the machined work piece was such that the cutting edge is intermitted twice during each revolution.

| Cutting data: | |
| --- | --- |
| Speed | 150 m/min |
| Cutting depth | 2.0 mm |
| Feed | 0.1 mm/rev |

The inserts were run one cut over the face of the work piece.

The results are expressed in the table below as percentage of the edge line in cut that obtained flaking as well as the rake face area subjected to flaking in relation to total contact area between the rake face and the work piece chip.

|   |   | Flaking (%) | |
|---|---|---|---|
|   |   | Edge Line | Rake Face |
| A) | single phase/textured $\alpha$-$Al_2O_3$ (according to the invention) | 0 | 0 |
| B) | $\alpha/\kappa$-$Al_2O_3$ | 40 | 5 |
| C) | $\kappa$-$Al_2O_3$ | 15 | 45 |

EXAMPLE 2

Coated inserts from A) in Example 1 were tested in a machining operation comprising external roughing with interrupted cuts. The test was carried out at an end user of cutting tools and the machined component was a differential hub made in nodular cast iron (AISI 60-40-18, DIN GGG 40).

| Cutting data: | |
|---|---|
| Speed | 270–290 m/min |
| Cutting depth | 2 mm |
| Feed | 0.4–0.55 mm/rev |

A commercial cemented carbide cutting tool with identical carbide composition as A) in Example 1 and, further, comprising a coating of 2 µm TiC and 8 µm $Al_2O_3$, was used as a reference in the cutting test. The $Al_2O_3$-layer was deposited according to the prior art technique resulting in a mixture of coarse $\alpha$- and fine $\kappa$-$Al_2O_3$ grains in the coating.

Said commercial tool insert is frequently used in the machining of nodular cast iron.

All inserts used in the above machining test of a differential hub were wet blasted with 150 mesh $Al_2O_3$ powder.

After machining 20 components, the commercial tool insert with $\alpha/\kappa$ coating showed excessive flaking with loss of the coating on more than 70% of the edge line in cut. The coated inserts from A) in Example 1, according to the invention, machined 40 components with less than 10% of the edge line in cut showing flaking.

EXAMPLE 3

D) Cemented carbide inserts with a composition 6.5% Co, 8.8% cubic carbides and balance WC were coated as set forth under A) in Example 1. A fine-grained, dense $\alpha$-$Al_2O_3$-coating textured in the (012) direction was obtained.

E) The carbide substrate of D) was coated as set forth under B) in Example 1. An alumina coating comprising a mixture of coarse $\alpha$- and $\kappa$-$Al_2O_3$ grains was obtained.

Coated tool inserts from D) and E) were all wet blasted with 150 mesh $Al_2O_3$ powder in order to smooth the coating surface.

The cutting inserts were then tested with respect to edge line flaking in a facing operation in an alloyed steel (AISI 1518, W-no. 1,0580). The shape of the machined work piece was such that the cutting edge is intermitted three times during each revolution.

| Cutting data: | |
|---|---|
| Speed | 130–220 m/min |
| Cutting depth | 2 mm |
| Feed | 0.2 mm/rev |

The inserts were run one cut over the face of the work piece.

The result below is expressed as percentage of the edge line in cut that obtained flaking.

|   |   | Flaking (%) Edge Line |
|---|---|---|
| D) | single phase/textured $\alpha$-$Al_2O_3$ (according to the invention) | 0 |
| E) | $\alpha/\kappa$ $Al_2O_3$ | 40 |

EXAMPLE 4

F) Cemented carbide inserts with a composition 6.5% Co, 8.5% of cubic carbides and balance WC were coated as set forth under A) in Example 1. A 6 µm thick, fine-grained, dense $\alpha$-$Al_2O_3$ coating textured in the (012) direction was obtained.

G) The carbide substrate of F) was coated as set forth under B) in Example 1. An alumina coating comprising a mixture of coarse $\alpha$- and fine $\kappa$-$Al_2O_3$ grains was obtained.

Coated tool inserts from F) and G) were all wet blasted with 150 mesh $Al_2O_3$ powder in order to smooth the coating surface.

The cutting inserts were then tested With respect to rake face flaking in a facing operation in austenitic stainless steel (AISI 304L, W-no. 1,4306). The shape of the machined work piece was tubular and the inserts were run two cuts over the face of the work piece.

| Cutting data: | |
|---|---|
| Speed | 140 m/min |
| Cutting depth | 0–3 mm |
| Feed | 0.36 mm/rev |

The result below is expressed as percentage of the area on the rake face subjected to flaking in relation to the total contact area between the chip and the rake face of the insert.

|   |   | Flaking (%) Edge Line |
|---|---|---|
| F) | single phase/textured $\alpha$-$Al_2O_3$ (according to the invention) | 25 |
| G) | $\alpha/\kappa$ $Al_2O_3$ | 65 |

EXAMPLE 5

H) Cemented carbide inserts with a composition of 6.5% Co, 8.5% of cubic carbides and balance WC were coated as set forth under F) in Example 4. A 6 µm thick, fine-grained, dense $\alpha$-$Al_2O_3$ coating textured in the (012) direction was obtained.

K) The carbide substrate of H was coated as set forth under G) in Example 4. An alumina coating comprising a mixture of coarse $\alpha$- and fine $\kappa$-$Al_2O_3$ grains was obtained.

Coated tool inserts from H) and K) were all wet blasted with 150 mesh $Al_2O_3$ powder in order to smooth the coating surface.

The cutting inserts were then tested with respect to edge line flaking in a facing operation in a cold forged steel (AISI 5015, W-no. 1,7015). The machined work piece was a gear wheel and the inserts were run 16 cuts over the face of the work piece.

| Cutting data: | |
|---|---|
| Speed | 180 m/min |
| Cutting depth | 1.5 mm |
| Feed | 0.25 mm/rev |

The result below is expressed as percentage of the edge line in cut that obtained flaking in accordance with previous Examples.

| | | Flaking (%) Edge Line |
|---|---|---|
| H) | single phase/textured α/$Al_2O_3$ (according to the invention) | 0 |
| K) | α/κ $Al_2O_3$ | 55 |

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A method of coating a cutting tool body with an α-alumina coating consisting essentially of heating the cutting tool body while bringing the cutting tool body in contact with a hydrogen carrier gas to which has been added $CO_2$, followed by CO, and than $AlCl_3$ so as to deposit an alpha-alumina layer on the cutting tool body, wherein the oxidation potential of the hydrogen carrier gas is controlled by maintaining a content of $H_2O$ in the carrier gas below 20 ppm of $H_2O$ prior to nucleation of said alpha-$Al_2O_3$.

2. The method of claim 1, wherein the $H_2O$ content of the hydrogen carrier gas is below 5 ppm of $H_2O$ prior to the nucleation of the alpha-$Al_2O_3$ and the nucleation is carried out at a temperature of about 1000° C.

3. The method of claim 1, wherein the alpha-alumina layer has a thickness (d) of 0.5–25 μm and a single phase α-structure with a grain size (s):

0.5 μm<s<1 μm for 0.5μ<d<2.5 μm and 0.5 μm<s<3 μm for 2.5μ<d<25 μm.

4. The method of claim 1, wherein the surface roughness ($R_a$) of the alpha-alumina layer is less than 0.3 μm over a measured length of 0.25 mm.

5. The method of claim 1, wherein the alpha-alumina layer exhibits a texture coefficient TC greater than 1.3 for the (012) growth direction of the equivalent crystallographic planes defined as:

$$TC(hkl) = \frac{I(hkl)}{I_o(hkl)} \left\{ \frac{1}{n} \Sigma \frac{I(hkl)}{I_o(hkl)} \right\}^{-1}$$

where

I(hkl)=measured intensity of the (hkl) reflection $I_o$(hkl)=standard intensity of the ASTM standard powder pattern diffraction data n=number of reflections used in the calculation, (hkl) reflections used are: (012), (104), (110), (113), (024), (116).

6. The method of claim 5, wherein the texture coefficient TC (012) is greater than 1.5.

7. The method of claim 1, wherein the cutting tool body includes an intermediate layer of a metal carbide, metal nitride or metal carbonitride, the alpha-alumina layer being deposited on the intermediate layer.

8. The method of claim 1, wherein the cutting tool body includes an intermediate layer of TiCN, the alpha-alumina layer being deposited on the intermediate layer.

* * * * *